(12) United States Patent
Liu

(10) Patent No.: US 10,700,174 B2
(45) Date of Patent: Jun. 30, 2020

(54) SPLIT-GATE FLASH MEMORY, METHOD OF FABRICATING SAME AND METHOD FOR CONTROL THEREOF

(71) Applicant: Shanghai Huahong Grace Semiconductor Manufacturing Corporation, Shanghai (CN)

(72) Inventor: Xianzhou Liu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/232,487

(22) Filed: Dec. 26, 2018

(65) Prior Publication Data
US 2019/0355824 A1 Nov. 21, 2019

(30) Foreign Application Priority Data
May 18, 2018 (CN) .......................... 2018 1 0483313

(51) Int. Cl.
| | |
|---|---|
| *H01L 29/423* | (2006.01) |
| *H01L 21/28* | (2006.01) |
| *G11C 16/04* | (2006.01) |
| *G11C 16/14* | (2006.01) |
| *G11C 16/26* | (2006.01) |
| *H01L 21/3213* | (2006.01) |
| *H01L 27/11521* | (2017.01) |
| *H01L 29/66* | (2006.01) |

(Continued)

(52) U.S. Cl.
CPC .... *H01L 29/42328* (2013.01); *G11C 16/0408* (2013.01); *G11C 16/0458* (2013.01); *G11C 16/08* (2013.01); *G11C 16/14* (2013.01); *G11C 16/26* (2013.01); *H01L 21/32139* (2013.01); *H01L 27/11521* (2013.01); *H01L 29/40114* (2019.08); *H01L 29/66825* (2013.01); *H01L 29/7883* (2013.01)

(58) Field of Classification Search
None
See application file for complete search history.

(56) References Cited

U.S. PATENT DOCUMENTS 4,331,968 A * 5/1982 Gosney, Jr. ......... H01L 29/7886
257/E29.307
5,198,380 A * 3/1993 Harari ................. G11C 11/5621
438/257

(Continued)

*Primary Examiner* — J. H. Hur
(74) *Attorney, Agent, or Firm* — Murtha Cullina LLP

(57) ABSTRACT

A split-gate flash memory, a method of fabricating the split-gate flash memory and a method for control thereof are disclosed. The split-gate flash memory includes: a semiconductor substrate including a first memory region and a second memory region that are separate from each other; and a word-line structure between the first memory region and the second memory region. The word-line structure includes, stacked on the surface of the semiconductor substrate sequentially from bottom to top, a word-line oxide layer, a read gate, a dielectric oxide layer and an erase gate. The read and erase gates can each function as a word line of the split-gate flash memory for enabling a read or erase operation. During the erase operation, a voltage applied on the erase gate has an insignificant impact on the underlying semiconductor substrate, which is helpful in reducing channel leakage in the semiconductor substrate.

12 Claims, 6 Drawing Sheets

(51) Int. Cl.
  *H01L 29/788* (2006.01)
  *G11C 16/08* (2006.01)

(56) References Cited

U.S. PATENT DOCUMENTS

| | | | | |
|---|---|---|---|---|
| 5,677,872 A * | 10/1997 | Samachisa | ............ | G11C 5/025 |
| | | | | 365/185.14 |
| 5,991,204 A * | 11/1999 | Chang | ............... | G11C 16/0416 |
| | | | | 257/E21.689 |
| 6,040,216 A * | 3/2000 | Sung | .................... | H01L 27/115 |
| | | | | 438/257 |
| 8,778,761 B2 * | 7/2014 | Gu | ................... | H01L 29/66825 |
| | | | | 257/E21.422 |
| 8,780,625 B2 * | 7/2014 | Gu | ................... | H01L 29/42332 |
| | | | | 365/185.01 |
| 2013/0223148 A1 * | 8/2013 | Seo | ........................ | H01L 27/04 |
| | | | | 365/185.11 |
| 2014/0269102 A1 * | 9/2014 | Hewitt | ............... | G11C 16/0416 |
| | | | | 365/185.29 |
| 2017/0040334 A1 * | 2/2017 | Cheng | ............... | H01L 27/11524 |
| 2019/0214396 A1 * | 7/2019 | Wang | ............... | H01L 27/11521 |

* cited by examiner

SPLIT-GATE FLASH MEMORY, METHOD OF FABRICATING SAME AND METHOD FOR CONTROL THEREOF

CROSS-REFERENCE TO RELATED APPLICATION

This application claims the priority of Chinese patent application number 201810483313.5, filed on May 18, 2018, the entire contents of which are incorporated herein by reference.

TECHNICAL FIELD

The present invention relates to the field of semiconductor technology and, in particular, to a split-gate flash memory, a method of fabricating the split-gate flash memory and a method for control thereof.

BACKGROUND

Memory devices are used to store massive digital information. Over the past several years, advances in processes and techniques and market demands have given rise to increasing diversification of memory device species. Among the variety of existing memory devices, flash memories are developing particularly fast and have found extensive application because they can maintain the stored information for a long time without power supply, in addition to other many advantages including high integration, fast access, and ease of erasing and rewriting.

A flash memory is comparable in basic structure to a MOS transistor including a source, a drain and a gate (control gate, CG) except that the flash memory further includes a floating gate (FG). The FG of the flash memory is located between the control gate and a conductive channel so as to be isolated from all other electrodes. Due to the presence of the floating gate, the flash memory can be controlled to perform three basic operations: programming, reading; and erasing.

In general, flash memory can be divided by their gate structure into stacked-gate ones and split-gate ones. Split-gate flash memories are widely used because of their low programming voltages, high programming efficiency and effective avoidance of over-erasing.

FIG. 1 schematically illustrates the architecture of a conventional split-gate flash memory. As shown in FIG. 1, the split-gate flash memory 100 includes: a semiconductor substrate 101; a source line 102 and a drain line 103, serving as bit lines (BLs) and extending on the semiconductor substrate 101 at a certain interval; and a word line (WL) 104 formed above the semiconductor substrate 101 between the source line 102 and the drain line 103. A word-line oxide layer 105 is formed between the word line 104 and the semiconductor substrate 101. A first memory bit cell 110 and a second memory bit cell 120 having the same structure are disposed on opposing sides of the word line 104. With the first memory bit cell 110 as an example, it includes a floating-gate oxide layer 106 on the surface of the semiconductor substrate 101, a floating gate 107 resting on the floating-gate oxide layer 106, a control-gate dielectric layer 108 on the floating gate 107 and a control gate 109 on the control-gate dielectric layer 108. The floating gate 107 and the word line 104 are intervened by a tunneling oxide layer 111. With suitable voltages applied on the source line 102, the drain line 103, the word line 104 and the control gate 108, the split-gate flash memory 100 can be controlled to perform program, read and erase operations.

In continuation of the example illustrated in FIG. 1, on the one hand, during an erase operation of the split-gate flash memory 100, electrons in the floating gate 107 will travel through the tunneling oxide layer 111 into the word line 104. An overlap between the floating gate 107 and the word line 104 (marked by a dotted line circle A in FIG. 1) determines a coupling ratio between the floating gate 107 and the word line 104. As long as the tunneling is enabled, the lower the coupling ratio is, the stronger an electric field is created between the floating gate 107 and word line 104 under the same conditions, and the better the erasing performance will be. In other words, within a certain range, reducing the overlap between the word line 104 and the floating gate 107 is conducive to the erasing efficiency.

On the other hand, the continuous enhancement in the integration of semiconductor components is bringing about increasing miniaturization of split-gate flash memories, fabricating short-channel effect suppression more and more important to leakage control. However, in order to account for a channel resistance induced by the word line, the conventional split-gate flash memory 100 has to maintain a relative high voltage (usually higher than 4 V) on the word line and a rather great thickness (about 100 Å to 200 Å) of the word-line oxide layer 105. Additionally, the coupling between the word line 104 and the floating gate 107 can lower a word line-induced barrier, causing increased channel leakage currents and a considerable short-channel effect. This may hinder the mass production of the split-gate flash memory.

Therefore, it is necessary for the conventional split-gate flash memory to be further improved in terms of structure and control.

SUMMARY OF THE INVENTION

In order to overcome the above deficiencies of the conventional split-gate flash memory, the present invention proposes a split-gate flash memory, a method of fabricating the split-gate flash memory and a method for control thereof, which mainly offer the advantages as follows: 1) a thinner word-line oxide layer and hence a lower channel resistance; 2) short-channel effect suppression; and 3) a lower word line-floating gate coupling ratio that allow higher erasing efficiency.

In a first aspect of the present invention; there is proposed a split-gate flash memory, including: a semiconductor substrate including a first memory region and a second memory region separate from each other; and a word-line structure between the first memory region and the second memory region; the word-line structure including, stacked on a surface of the semiconductor substrate sequentially from bottom to top, a word-line oxide layer, a read gate, a dielectric oxide layer and an erase gate.

Optionally, the semiconductor substrate may further include a connect-out region that is separate from each of the first memory region; the second memory region and the word-line structure, wherein the split-gate flash memory further includes a read-gate connect-out layer over the connect-out region, and wherein the read gate extends to the connect-out region and is connected with the read-gate connect-out layer.

Optionally, the read-gate connect-out layer may have a width that is smaller than a width of the read gate and an upper surface that is higher than an upper surface of the read gate.

Optionally, the upper surface of the read-gate connect-out layer may be flush with an upper surface of the erase gate.

Optionally, the split-gate flash memory may further include a first memory bit structure over the first memory region of the semiconductor substrate and a second memory bit structure over the second memory region of the semiconductor substrate, the first memory bit structure including, stacked on the surface of the semiconductor substrate sequentially from bottom to top; a first floating gate, a first control-gate dielectric layer, a first control gate and a first sidewall, the second memory bit structure including, stacked on the surface of the semiconductor substrate sequentially from bottom to top, a second floating gate, a second control-gate dielectric layer, a second control gate and a second sidewall, the first and second sidewalls extending to the connect-out region and sandwiching the read-gate connect-out layer.

Optionally, the erase gate may have a lower surface that is lower than or flush with upper surfaces of the first and second floating gates.

Optionally, the dielectric oxide layer may be located between the first floating gate and the erase gate and between the second floating gate and the erase gate and serve as a tunneling oxide layer for the split-gate flash memory.

Optionally, the word-line oxide layer may have a thickness of from 20 Å to 100 Å, with the dielectric oxide layer having a thickness of from 80 Å to 200 Å.

In another aspect of the present invention, there is proposed a method of fabricating a split-gate flash memory, including the steps of: providing a semiconductor substrate including a first memory region and a second memory region separate from each other; and forming a word-line structure between the first memory region and the second memory region, the word-line structure including, stacked on a surface of the semiconductor substrate sequentially from bottom to top, a word-line oxide layer, a read gate, a dielectric oxide layer and an erase gate.

Optionally, the semiconductor substrate may include an active region containing both the first memory region and the second memory region and an isolation region containing a connect-out region, wherein the method further includes, prior to the formation of the word-line structure, the steps of: sequentially depositing a floating-gate oxide layer, a floating-gate layer, a control-gate dielectric layer, a control-gate layer and a hard mask layer over the active region of the semiconductor substrate, wherein each of the floating-gate oxide layer, the control-gate dielectric layer, the control-gate layer and the hard mask layer further covers the isolation region of the semiconductor substrate; forming a first trench that penetrates through the hard mask layer, the first trench extending from the active region to the isolation region and having a first width over the active region and a second width over the isolation region that is smaller than the first width; forming first sub-sidewalk within the first trench, and with the first sub-sidewalks and the remaining hard mask layer together serving as a mask, etching the control-gate layer and the control-gate dielectric layer to form a second trench that penetrates through each of the hard mask layer, the control-gate layer and the control-gate dielectric layer; and forming second sub-sidewalk which cover the first sub-sidewalls and end faces of the control-gate layer and the control-gate dielectric layer under the first sub-sidewalk, and with the first sub-sidewalk, the second sub-sidewalk and the hard mask layer together serving as a mask, etching the floating-gate layer to form a word-line trench that penetrates through each of the hard mask layer, the control-gate layer, the control-gate dielectric layer and the floating-gate layer, the word-line trench extending from the active region to the isolation region and having a third width over the active region and a fourth width over the isolation region that is smaller than the third width.

Optionally, the formation of the word-line structure may include the steps of: forming the word-line oxide layer over the semiconductor substrate with the word-line trench formed therein; forming a read-gate layer over the word-line oxide layer and etching back the read-gate layer to form the read gate and a read-gate connect-out layer, the read-gate connect-out layer having an upper surface higher than upper surface of the read gate; forming the dielectric oxide layer over the semiconductor substrate with the read gate and the read-gate connect-out layer formed thereon; and forming an erase-gate material layer over the dielectric oxide layer and removing a portion of the erase-gate material layer over the isolation region so that a remainder of the erase-gate material layer within the word-line trench constitutes the erase gate and that the word-line oxide layer, the read gate, the dielectric oxide layer and the erase gate collectively constitute the word-line structure.

Optionally, the method may further include, subsequent to the formation of the word-line structure, the steps of: etching the hard mask layer and the control-gate layer, the control-gate dielectric layer and the floating-gate layer underlying the hard mask layer, thereby forming a first memory bit structure over the first memory region and a second memory bit structure over the second memory region on opposing sides of the word-line structure.

In another aspect of the present invention, there is provided a method for control of a split-gate flash memory, wherein the split-gate flash memory includes: a semiconductor substrate including a first memory region and a second memory region separate from each other; and a word-line structure between the first memory region and the second memory region, the word-line structure including, stacked on a surface of the semiconductor substrate sequentially from bottom to top, a word-line oxide layer, a read gate, a dielectric oxide layer and an erase gate, wherein the method includes: performing a read operation by grounding or floating the erase gate and applying a word-line reading voltage to the read gate; and/or performing an erase operation by grounding or floating the read gate and applying a word-line erasing voltage to the erase gate.

Optionally, the word-line reading voltage may of from 1 V to 2 V, with the word-line erasing voltage of from 7 V to 9 V.

In the split-gate flash memory provided in the present invention, as the word-line structure is constructed on the semiconductor substrate between the first memory region and the second memory region as a stack of the word-line oxide layer, the read gate, the dielectric oxide layer and the erase gate, each of the read and erase gates can function as a word line for the split-gate flash memory to enable a read or erase operation. Compared to conventional split-gate flash memories (e.g., that of FIG. 1), the word-line oxide layer can be made thinner. As a result, during the erase operation, a lower voltage is allowed to be applied to the read gate, which can reduce a channel resistance induced by the word-line structure. Moreover, the read gate is also thinner, which can lower or even eliminate a word line-induced barrier, thereby achieving leakage current suppression and short-channel effect suppression.

In addition, in the split-gate flash memory provided in the present invention, since the word line depends only in part on the erase gate, compared to conventional devices, the split-gate flash memory of the invention has a lower erase gate-floating gate coupling ratio and thus requires a lower erase gate-floating gate coupling voltage, which can result in a stronger electric field and improved erasing efficiency.

Further, the split-gate flash memory provided in the present invention may include a read-gate connect-out layer that protrudes over the read gate and is not covered by the erase gate. Thus, the read gate of the split-gate flash memory can be externally connected via the read-gate connect-out layer.

In the method of fabricating the split-gate flash memory provided in the present invention, during the formation of the word-line structure, the read gate and the erase gate for enabling read and erase operations are stacked together and isolated from each other. This is helpful in channel leakage suppression in the underlying semiconductor substrate when a high voltage is applied to the erase gate during the erase operation. Accordingly, the word-line oxide layer may be made thinner, reducing the required word-line reading voltage and hence a channel resistance induced by the word-line structure. Moreover, the dielectric oxide layer may be formed between the first memory bit structure and the erase gate and between the second memory bit structure and the erase gate so as to provide a tunneling oxide layer between the first floating gate and the erase gate and between the second floating gate and the erase gate.

In the method for control of the above split-gate flash memory, read and erase operations are enabled by the read and erase gates that are independent from each other, thus helping in channel leakage suppression when a high voltage is applied to the word line during the erase operation. In addition, a lower word-line reading voltage is required because of the reduced word-line oxide layer thickness, which is conducive to short-channel effect suppression. Further, a window between the states in which the read and erase operations are performed can be expanded, which is favorable to mass production.

Since the split-gate flash memory can be respectively made and controlled by the above methods, they offer the same or analogous advantages.

Figure 1:
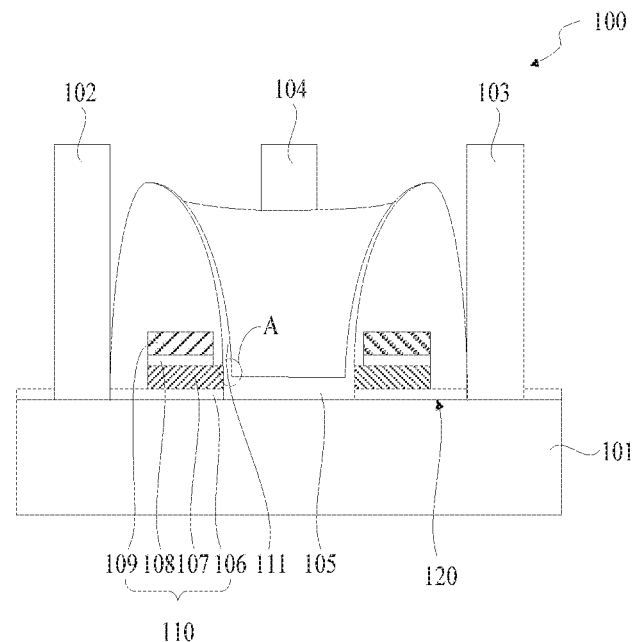
FIG. 1 is a schematic cross-sectional view of a split-gate flash memory.

DESCRIPTION OF REFERENCE NUMERALS IN THE FIGURES 100 and 200—split-gate flash memories; 101 and 201—semiconductor substrates; 102—source line; 103—drain line; 104—word line; 105—word-line oxide layer; 110—first memory bit cell; 120—second memory bit cell; 106—floating-gate oxide layer; 107—floating gate; 108—control-gate dielectric layer; 109—control gate; 111—tunneling oxide layer; 10—first memory region; 20—second memory region; 210—word-line structure; 211—word-line oxide layer; 212—read gate; 213—dielectric oxide layer; 214—erase gate; 220—first memory bit structure; 221—first floating-gate oxide layer; 222—first floating gate; 223—first control-gate dielectric layer; 224—first control gate; 225—first sidewall; 230—second memory bit structure; 231—second floating-gate oxide layer; 232—second floating gate; 233—second control-gate dielectric layer; 234—second control gate; 235—second sidewall; 202—isolation structure; 203—floating-gate oxide layer; 204—floating-gate layer; 205—control-gate dielectric layer; 206—control-gate layer; 207—hard mask layer; 30—connect-out region; 212a—read-gate connect-out layer; 40—first trench; 41—first sub-sidewall; 50—second trench; 51—second sub-sidewall; 60—word-line trench; 208—capping layer.

DETAILED DESCRIPTION

The split-gate flash memory, the method of fabricating the split-gate flash memory and the method for control thereof, proposed in the present invention will be described in greater detail with reference to a few specific embodiments which are to be read in conjunction with the accompanying drawings so that those skilled in the art can better understand the subject matter disclosed herein. Features and advantages of the invention will be more apparent from the following detailed description, and from the appended claims. Note that the accompanying drawings are provided in a very simplified form not necessarily presented to scale, with the only intention of facilitating convenience and clarity in explaining the several embodiments of the invention. Embodiments of the present invention should not be construed as being limited to the particular shapes illustrated in the appended figures. For the sake of clarity, like elements are principally given the same or analogous reference numerals throughout the figures for facilitating the explanation of the disclosed embodiments. In addition, like elements will not be repeatedly described hereinafter, and the associated reference numerals will not be marked in all the figures.

Further, the terminology used herein is for the purpose of describing particular embodiments only and is not intended to be limiting of the invention. As used herein, the singular forms "a," "an" and "the" are intended to include the plural forms as well, unless the context clearly indicates otherwise. It will be understood that the terms "comprises," "comprising," "includes" and/or "including," when used herein, specify the presence of stated features, steps, operations, elements, components and/or groups thereof. The terms "first", "second", etc. are used to distinguish similar elements from each other and are not necessarily used for describing a particular order, neither in time nor in ranking. It will be understood that such terms may be used interchangeably as appropriate. Likewise, if any method described herein includes a sequence of steps, it will be readily understood that the order of the steps presented herein does not have to be the only order in which the steps may be performed, and some of the steps may be omitted and/or some other steps not described herein may be added to the method. Spatially relative terms, such as "on", "over", "on top of", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted or otherwise oriented (e.g., rotated), the exemplary term "over" can also encompass an orientation of "under" or another orientation.

Figure 2:
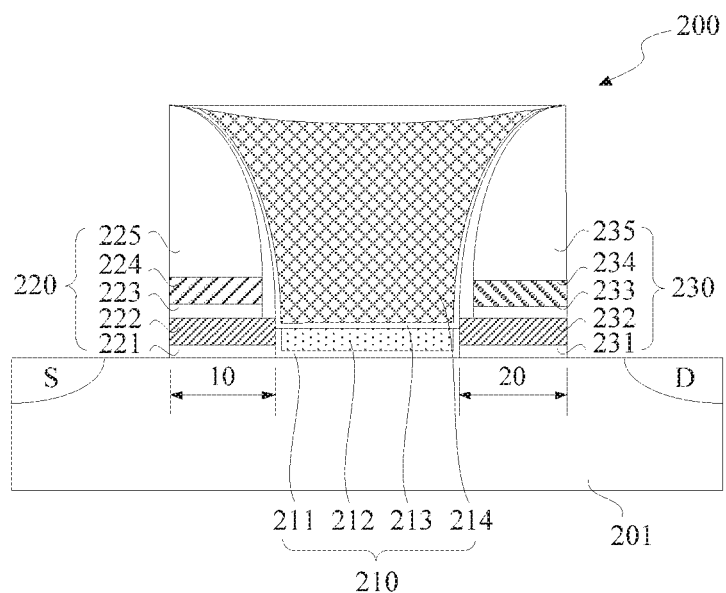
FIG. 2 is a schematic cross-sectional view of a prior art split-gate flash memory according to embodiments of the present invention.

FIG. 2 schematically illustrates a split-gate flash memory according to embodiments of the present invention. As shown in FIG. 2, the split-gate flash memory 200 includes: a semiconductor substrate 201 containing a first memory region 10 and a second memory region 20 separate from the first memory region 10; and a word-line structure 210 on the surface of the semiconductor substrate 201 substantially between the first memory region 10 and the second memory region 20. The word-line structure 210 includes, stacked on the surface of the semiconductor substrate 201 sequentially from bottom to top, a word-line oxide layer 211, a read gate 212, a dielectric oxide layer 213 and an erase gate 214.

The word-line structure 210 is configured to serve as a word line during control of the split-gate flash memory 200. Specifically, it may function to apply a word line voltage onto the read gate 212 or erase gate 214 so that the split-gate flash memory 200 correspondingly carries out a read or erase operation.

The split-gate flash memory 200 may also include a first memory bit structure 220 over the first memory region 10 and a second memory bit structure 230 over the second memory region 20. The first memory bit structure 220 and the second memory bit structure 230 may co-share the word-line structure 210 therebetween so that the split-gate flash memory 200 is able to store two bits of data. The first memory bit structure 220 and the second memory bit structure 230 can be structured as well known in the art.

Referring to FIG. 2, in some embodiment of the present invention, the first memory bit structure 220 may include a first floating-gate oxide layer 221 on the surface of the semiconductor substrate 201, a first floating gate 222 on the first floating-gate oxide layer 221, a first control-gate dielectric layer 223 on the first floating gate 222, a first control gate 224 on the first control-gate dielectric layer 223 and a first sidewall 225. The first sidewall 225 covers an upper surface of the first control gate 224 and end faces of the first control gate and the first control-gate dielectric layer 223 that face toward the erase gate 214. Additionally, the second memory bit structure 230 may include a second floating-gate oxide layer 231 on the surface of the semiconductor substrate 201, a second floating gate 232 on the second floating-gate oxide layer 231, a second control-gate dielectric layer 233 on the second floating gate 232, a second control gate 234 on the second control-gate dielectric layer 233 and a second sidewall 235. The second sidewall 235 covers an upper surface of the second control gate 234 and end faces of the second control gate 234 and the second control-gate dielectric layer 233 that face toward the erase gate 214.

In the word-line structure 210, the read gate 212 is located under the erase gate 214. In order to facilitate the control over the read gate 212, in some embodiments of the present invention, the split-gate flash memory 200 may further include a connect-out region within the semiconductor substrate 201 for external connection of the read gate 212.

Figure 3:
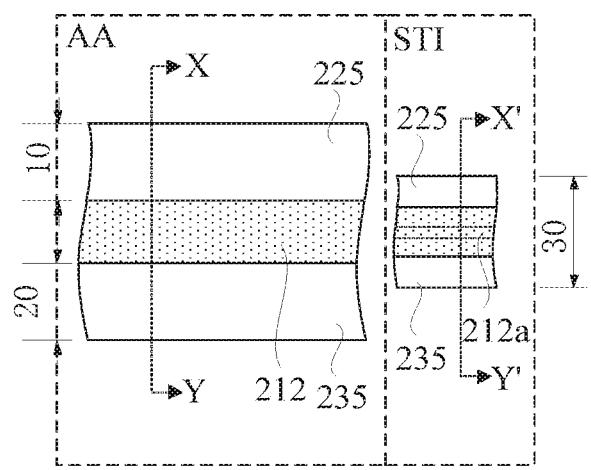
FIG. 3 is a schematic plan view showing a first memory region, a second memory region and a connect-out region according to embodiments of the present invention.

FIG. 3 is a schematic plan view showing the first memory region, the second memory region and the connect-out region according to embodiments of the present invention. The connect-out region will be described in detail below with reference to FIGS. 2 to 3.

In the semiconductor substrate 201, the connect-out region 30 is separate from both of the first memory region 10 and the second memory region 20. In a preferred embodiment, the first memory region 10 and the second memory region 20, along with the word-line structure 210 therebetween, correspond to an active region (i.e., the AA region), while the connect-out region 30 corresponds to an isolation region containing, for example, a shallow trench isolation (STI).

The read gate 212 between the first memory region 10 and the second memory region 20 may define a read-gate connect-out layer 212a in its extension over the connect-out region 30. That is, the read gate 212 and the read-gate connect-out layer 212a are formed by the same layer. In other words, the read gate 212 extends to the connect-out region 30 and is connected with the read-gate connect-out layer 212a.

Additionally, since within the active region, the read gate 212 is under the erase gate 214, in order to facilitate external electrical connection of the read-gate connect-out layer 214, i.e., to raise an upper surface of the read-gate connect-out layer 214, in a preferred embodiment, the first sidewall 225 and the second sidewall 235 on opposing sides of the read gate 212 extend toward the connect-out region 3C) so that they sandwich the read-gate connect-out layer 212a and hence define the shape of the read-gate connect-out layer 212a. As a result, for example, the read-gate connect-out layer 212a has a width that is smaller than a width of the read gate 212, and the upper surface of the read-gate connect-out layer 212a protrudes over an upper surface of the read gate 212. That is, the distance between the side of the read-gate connect-out layer 212a distal from the semiconductor substrate 201 and the surface of the semiconductor substrate 201 is greater than the distance between the side of the read gate 212 distal from the semiconductor substrate 201 and the surface of the semiconductor substrate 201. Here, the term "width" refers to the distance, in a plane parallel to the semiconductor substrate 201, between the two edges of the read gate 212 or of the read-gate connect-out layer 212a that extend in a direction perpendicular to the direction in which the read gate 212 extends. In some embodiments, the upper surface of the read-gate connect-out layer 212a may be close to or flush with the upper surface of the erase gate 214. This feature provides the advantage that the subsequent formation of erase and read electrodes on the erase gate 214 and the read-gate connect-out layer 212a, respectively, for external connection thereof, can be accomplished by a similar technique as employed in the conventional device to external connect the word line 104 (see FIG. 1). In this way, metal interconnects and contact plugs can be ore easily fabricated.

With continued reference to FIG. 2, in the word-line structure 210 of the split-gate flash memory 200, the word-line oxide layer 1 is situated between the semiconductor substrate 201 and the read gate 212 so that the erase gate 214 is separated from the semiconductor substrate 201 additionally by the read gate 212. As a result, a voltage applied on the erase gate 214 will have a reduced impact on channels in the underlying semiconductor substrate 201. That is, leakage currents in the channels will be suppressed. For this reason, the word-line oxide layer 211 is allowed to be made thinner, compared to conventional split-gate flash memories.

Still with continued reference to FIG. 2, in the word-line structure 210 of the split-gate flash memory 200, the dielectric oxide layer 213 is situated between the read gate 212 and the erase gate 214. In some embodiments, the dielectric oxide layer 213 may also be disposed between the opposing surfaces of the first and second memory bit structures 220, 230 so that the dielectric oxide layer 213 between the first floating gate 222 and the word-line structure 210 and between the second floating gate 232 and the word-line structure 210 can serve as a tunneling oxide layer for the split-gate flash memory 200. With such a design, during an erase operation, electrons in the first floating gate 222 or in the second floating gate 232 can travel through the dielectric oxide layer 213 into the erase gate 214 under the action of an applied voltage. In some other embodiments, prior to the formation of the erase gate 214, separate tunneling oxide layers may be formed on the surfaces of the first and second memory bit structures 220, 230 opposing to the erase gate 214.

In a preferred embodiment, the dielectric oxide layer 213 between the read gate 212 and the erase gate 214 has an upper surface that is lower than or flush with an upper surface of the first floating gate 222 (or the second floating gate 232), which is helpful in the tunneling of electrons from the first floating gate 222 (or the second floating gate 232) into the erase gate 214.

In embodiments of the present invention, the split-gate flash memory 200 may further include a source region S and a drain region D both in the semiconductor substrate 201, a source line (not shown) in electrical contact with the source region S and a drain line (not shown) in electrical contact with the drain region D. By way of example, the source region S may be formed on the side of the first memory region 10 in the semiconductor substrate 201 that is distal from the second memory region 20. The drain region D may be formed on the side of the second memory region 20 in the semiconductor substrate 201 that is distal from the first memory region 10. The source and drain lines can function as bit lines (BLs) during control of the split-gate flash memory 200.

By way of example, each of the word-line oxide layer 211, the dielectric oxide layer 213, the first floating-gate oxide layer 221 and the second floating-gate oxide layer 231 may be a silicon dioxide layer or a silicon oxynitride layer. The first control-gate dielectric layer 223 and the second control-gate dielectric layer 233 may each be formed of silicon dioxide, silicon nitride, silicon oxynitride or a combination thereof. Additionally, the first sidewall 225 and the second sidewall 235 may each be formed of silicon nitride, titanium nitride or silicon carbide. The first floating gate 222 and the second floating gate 232 may each be made of doped polysilicon. Further, each of the first control gate 224, the second control gate 234, the read gate 212, the erase gate 214 and the read-gate connect-out layer 212a may be fabricated from a metal, an alloy or doped polysilicon. Of course, the split-gate flash memory 200 may include additional materials or structures well known in the art.

In order for the subject matter disclosed hereinabove to be better implemented, in embodiments of the present invention, a method of fabricating a split-gate flash memory is provided.

With reference to FIGS. 2 and 3, the method essentially includes: providing a semiconductor substrate 201 containing a first memory region 10 and a second memory region 20 that are separate from each other; and forming a word-line structure 210 between the first memory region 10 and the second memory region 20. The word-line structure 210 includes, stacked on the surface of the semiconductor substrate 201 sequentially from bottom to top, a word-line oxide layer 211, a read gate 212, a dielectric oxide layer 213 and an erase gate 214.

In some embodiments, the semiconductor substrate 201 may further contain a connect-out region 30, and the method may further include the steps of forming a first memory bit structure 220 over the first memory region 10, a second memory bit structure 230 over the second memory region 20 and a read-gate connect-out layer 212a over the connect-out region 30, where the read-gate connect-out layer 212a is connected to the read gate 212. The first memory bit structure 220 may include a first sidewall 225, and the second memory bit structure 230 may include a second sidewall 235. The first sidewall 225 and the second sidewall 235 may both extend to the connect-out region 30 so as to sandwich the read-gate connect-out layer 212a. The read-gate connect-out layer 212a may have an upper surface that is higher than an upper surface of the read gate 212.

Figure 4:
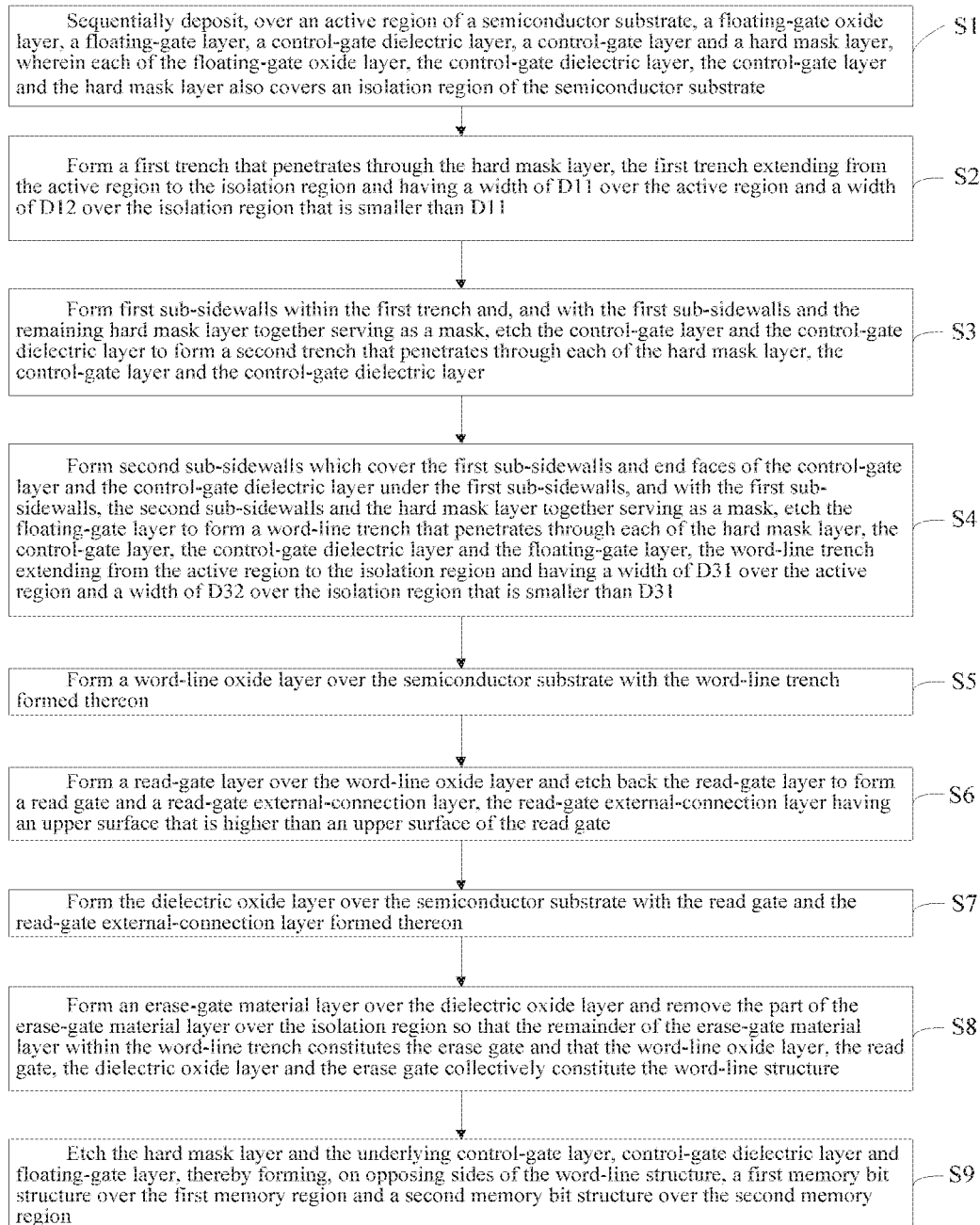
FIG. 4 shows a flowchart of a method of fabricating a split-gate flash memory in accordance with embodiments of the present invention.

FIG. 4 shows a flowchart of a method of fabricating a split-gate flash memory in accordance with embodiments of the present invention. FIGS. 5a to 5i are schematic cutaway views depicting process steps in a method of fabricating a split-gate flash memory in accordance with embodiments of the present invention. Each of the FIGS. 5a to 5i contains a cutaway view corresponding to that taken along the X-Y plane in FIG. 3 and another cutaway view corresponding to that taken along the X'-Y' plane in FIG. 3. It will be readily appreciated that the cutaway views of the connect-out region 30 are taken along a plane that is different from a plane along which the cutaway views of the first memory region 10 and the second memory region 20 are taken, and that the layout of FIGS. 5a to 5i is only intended to facilitate the illustration.

The semiconductor substrate 201 may include an active region (or AA region) and an isolation region (e.g., a STI region). The first memory region 10 and the second memory region 20 may correspond to the active region, and the connect-out region 30 may correspond to the isolation region. With reference to FIGS. 4 and 5a to 5i, the method may include the following steps.

Figure 5A:
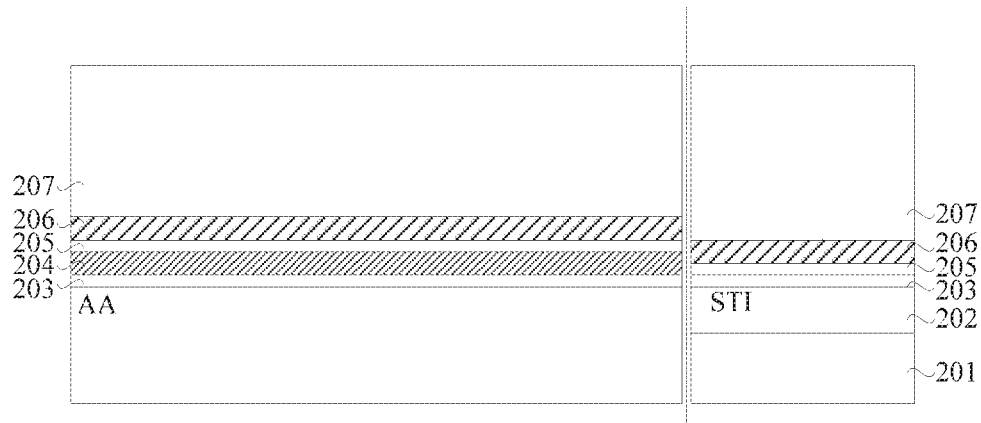
FIGS. 5a to 5i are schematic cutaway views depicting process steps in a method of fabricating a split-gate flash memory in accordance with embodiments of the present invention.

Referring to FIG. 5a, step S1 may include sequentially depositing, over the active region of the semiconductor substrate 201, a floating-gate oxide layer 203, a floating-gate layer 204, a control-gate dielectric layer 205, a control-gate layer 206 and a hard mask layer 207, wherein each of the floating-gate oxide layer 203, the control-gate dielectric layer 205, the control-gate layer 206 and the hard mask layer 207 also covers the isolation region of the semiconductor substrate 201.

By way of example, the semiconductor substrate 201 may be formed of a III-V material such as silicon, germanium, silicon germanium (SiGe), silicon carbide or gallium arsenide, or may be a silicon-on-insulator (SOI) substrate or a germanium-on-insulator (GOI) substrate. The semiconductor substrate 201 may have various doped regions depending on the design requirements of the split-gate flash memory. The floating-gate oxide layer 203 may be a silicon dioxide or silicon oxynitride layer. The control-gate dielectric layer 205 may be made of silicon dioxide, silicon nitride, silicon oxynitride or a combination thereof. The hard mask layer 207 may be a silicon nitride layer, a titanium nitride layer or a silicon carbide layer. The floating-gate layer 204 is optionally fabricated from doped polysilicon and the control-gate layer 206 is made from a metal, an alloy or doped polysilicon. The floating-gate layer 204 may be first deposited also over the isolation region, and the part over the isolation region may be subsequently removed during the formation of the isolation structure 202.

Figure 5B:
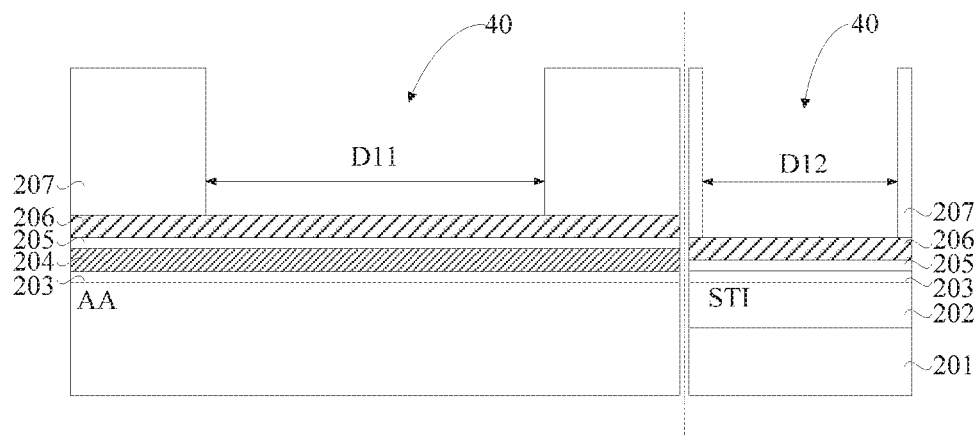

Referring to FIG. 5b, step S2 may include forming, by a photolithography and etching process, a first trench 40 that penetrates through the hard mask layer 207. The first trench 40 extends from the active region to the isolation region and has a width of D11 over the active region and a width of D12 over the isolation region that is smaller than D11.

By way of example, the photolithography and etching process may include forming a patterned photoresist layer over the hard mask layer 207 and etching the hard mask layer 207 to form the first trench 40 with the patterned photoresist layer serving as an etching mask.

Figure 5C:
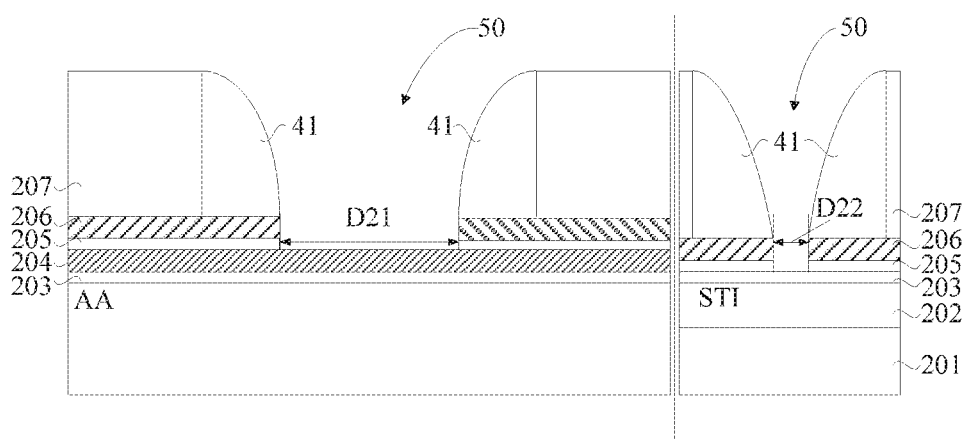

Referring to FIG. 5c, step S3 may include forming first sub-sidewalls 41 within the first trench 40 and, with the first sub-sidewalls 41 and the remaining hard mask layer 207 together serving as a mask, etching the control-gate layer 206 and the control-gate dielectric layer 205 to form a second trench 50 that penetrates through each of the hard mask layer 207, the control-gate layer 206 and the control-gate dielectric layer 205. Due to the protection of side surfaces, as well as the pails of a bottom surface that continue the side surfaces, of the first trench 40 by the first sub-sidewalls 41, the second trench 50 has a width of D21 over the active region and a width of D22 over the isolation region that is smaller than D21. The first sub-sidewalls 41 and the second trench 50 may be fabricated using any suitable process disclosed in the art, and a detail description thereof is deemed unnecessary and omitted herein.

Figure 5D:
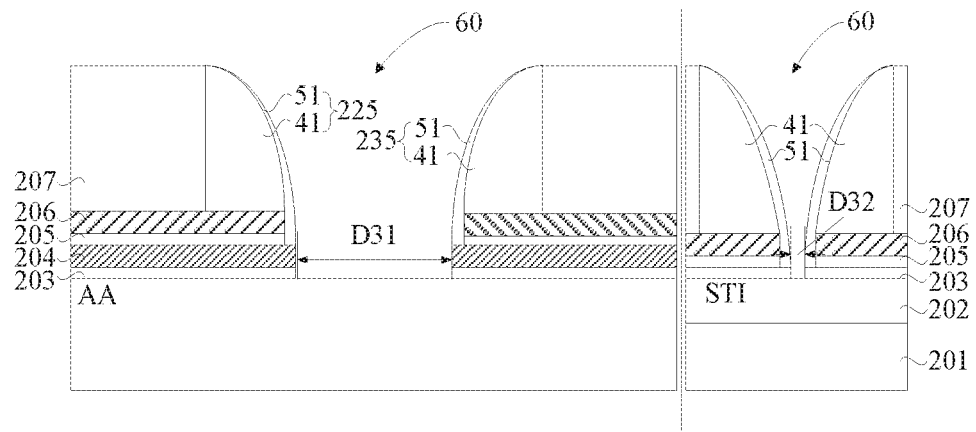

Referring to FIG. 5d, step S4 may include forming second sub-sidewalls 51 which cover the first sub-sidewalls 41 and end faces of the control-gate layer 206 and the control-gate dielectric layer 205 under the first sub-sidewalls 41, and with the first sub-sidewalls 41, the second sub-sidewalls 51 and the hard mask layer 207 together serving as a mask, etching the floating-gate layer 204 to form a word-line trench 60 that penetrates through each of the hard mask layer 207, the control-gate layer 206, the control-gate dielectric layer 205 and the floating-gate layer 204. The word-line trench 60 extends from the active region to the isolation region and has a width of D31 over the active region and a width of D32 over the isolation region that is smaller than D31.

In the structure resulting from step S4, the floating-gate oxide layer 203 exposed at the bottom of the word-line trench 60 is vulnerable to damages. For this reason, with reference to FIG. 5d, the exposed part of the floating-gate oxide layer 203 may be removed prior to the formation of the word-line structure.

It will be readily appreciated by those skilled in the art that, since D11>D12, the processes for forming the first sub-sidewalls 41, the second sub-sidewalls 51, the second trench 50 and the word-line trench 60 may be controlled to make the widths of the second trench 50 and the word-line trench 60 satisfy: D11>D21>D31; D12>D22>D32; and D21>D22, D31>D32. For the sake of clarity, the first sub-sidewalls 41 and the second sub-sidewalls 51 over the opposing side surfaces of the word-line trench 60 are regarded as constituting a first sidewall 225 and a second sidewall 235. In practice, the side surfaces of the first trench 40, the second trench 50 and the word-line trench 60 may not be necessarily vertical. For the sake of accuracy, the widths D11, D12, D21, D22 and D31 may be considered as the minimum widths of the respective trenches or as their widths in a same single plane parallel to the semiconductor substrate 201.

In step S4, as the second trench 50 is very narrow over the isolation region, the second trenches 50 deposited over their side surfaces may either be separate from or joined to each other there. This will not pose any significant impact on the subsequent formation of a read-gate connect-out layer in the isolation region.

By way of example, the formation of the floating-gate oxide layer 203, the floating-gate layer 204, the control-gate dielectric layer 205, the control-gate layer 206, the hard mask layer 207, the first sidewall 225 and the second sidewall 235 may involve chemical vapor deposition (CVD), physical vapor deposition (PVD), atomic layer deposition (ALD), high density plasma CVD (HDPCVD), metal organic CVD (MOCVD), plasma enhanced CVD (PECVD) or other suitable deposition process. Moreover, the formation of the floating-gate oxide layer 203 and the dielectric layer 205 may further involve thermal oxidation, rapid thermal annealing (RTA), in-situ steam generation (ISSG), decoupled plasma nitridation (DPN) or other suitable processes. The etching and removal in the above steps may be accomplished h a dry or wet etching process.

Subsequently, a word-line structure is formed in the word-line trench 60. In some embodiments, the formation of the word-line structure may include the following steps.

Figure 5E:
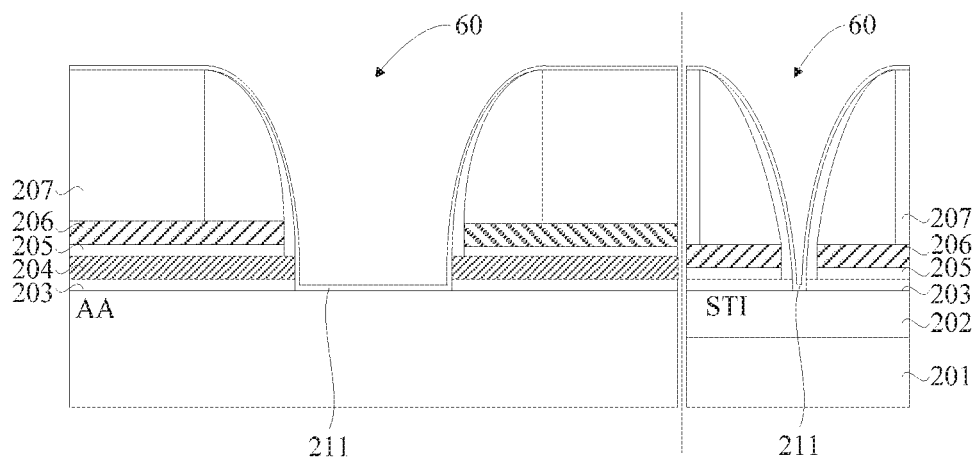

Referring to FIG. 5e, step S5 may include forming a word-line oxide layer 211 over the semiconductor substrate 201 with the word-line trench 60 formed thereon. By way of example, the word-line oxide layer 211 may be an oxide layer grown on the semiconductor substrate 201 with the word-line trench 60 formed thereon by means of thermal oxidation, CVD or the like. The word-line oxide layer 211 may have a thickness of, for example, 20 Å to 100 Å, which is smaller compared to a word-line oxide layer thickness adopted in the conventional split-gate flash memory.

Figure 5F:
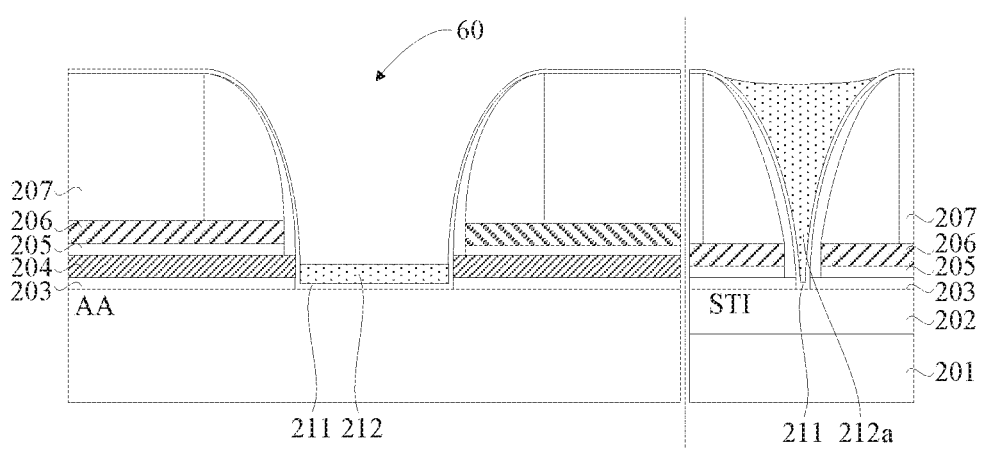

Referring to FIG. 5f, step S6 may include forming a read-gate layer over the word-line oxide layer 211 and etching back the read-gate layer to form a read gate 212 and a read-gate connect-out layer 212a having an upper surface that is higher than an upper surface of the read gate 212.

Due to the fact that the width of the word-line trench 60 varies from the active region to the isolation region, an appropriate etch-back process may be selected to form the read-gate connect-out layer 212a whose upper surface is higher than that of the read gate 212. Moreover, the upper surface of the read gate 212 is preferably lower than an upper surface of the floating-gate layer 204 so that a lower surface of an erase gate subsequently formed on the read gate 212 is close to or lower than the upper surface of the floating-gate layer 204. This is conducive to the tunneling of electrons from the first floating gate or from the second floating gate into the erase gate during the operation of the split-gate flash memory. In a preferred embodiment, the word-line trench 60 is fully filled with the read-gate connect-out layer 212a over the isolation region. In other words; over the isolation region, the upper surface of the read-gate connect-out layer 212a is flush with an upper surface of the hard mask layer 207.

Figure 5G:
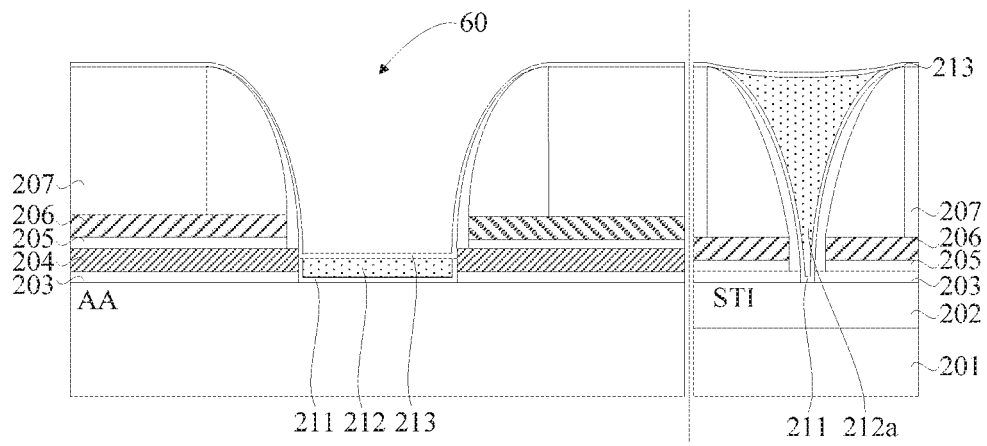

Referring to FIG. 5g, step S7 may include forming a dielectric oxide layer 213 over the semiconductor substrate 201 with the read gate 212 and the read-gate connect-out layer 212a formed thereon.

In embodiments of the present invention, the dielectric oxide layer 213 is formed to isolate the read gate 212 from an isolation gate formed subsequently above the read gate 212. In a preferred embodiment, the dielectric oxide layer 3 may also serve as a tunneling oxide layer (tunneling oxide) between the isolation gate and the first and second floating gates of the split-gate flash memory. The dielectric oxide layer 213 may have a thickness of about 80 Å to 200 Å.

In some embodiments, as shown in FIG. 5g, prior to the formation of the dielectric oxide layer 213, the word-line oxide layer 211 covering the side surfaces of the word-line trench 60 may be removed. This, however, is not mandatory.

Figure 5H:
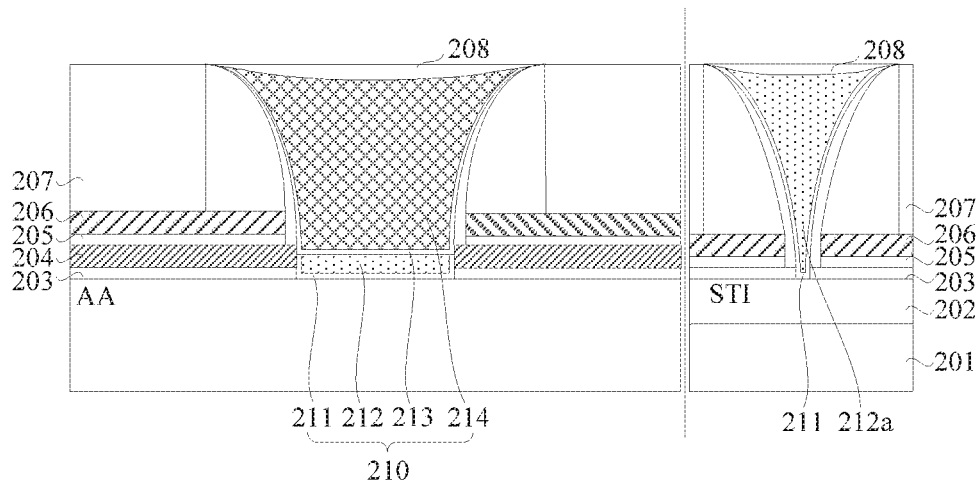

Referring to FIG. 5h, step S8 may include forming an erase-gate material layer ver the dielectric oxide layer 213 and removing the part of the erase-gate material layer over the isolation region so that the remainder of the erase-gate material layer within the word-line trench 60 constitutes an erase gate 214.

By way of example, step S8 may specifically include: first, filling the word-line trench 60 with the erase-gate material layer; performing a planarization process (e.g., chemical mechanical polishing, CMP), making an upper surface of the erase-gate material layer flush with the upper surface of the hard mask layer 207; and etching away the erase-gate material layer on the surface of the read-gate connect-out layer 212a, so that the erase-gate material layer remaining within the word-line trench 60 constitutes the erase gate 214. In a preferred embodiment, the erase gate 214 has an upper surface that is flush with the upper surface of the read-gate connect-out layer 212a.

Subsequent to the formation of the erase gate 214, as shown in FIG. 5h, a capping layer 208 may be formed to cover the erase gate 214 and the read-gate connect-out layer 212a. The capping layer 208 can protect the erase gate 214, the read gate 212 and the read-gate connect-out layer 212a from damages during the subsequent processes and may be formed of silicon dioxide or silicon nitride.

The word-line oxide layer 211, read gate 212, dielectric oxide layer and erase gate 214 collectively constitute a word-line structure 210 of the split-gate flash memory 200 being fabricated.

Subsequent to the formation of the word-line structure 210, the method of fabricating a split-gate flash memory in accordance with embodiments of the present invention may further include the following step.

Figure 5I:
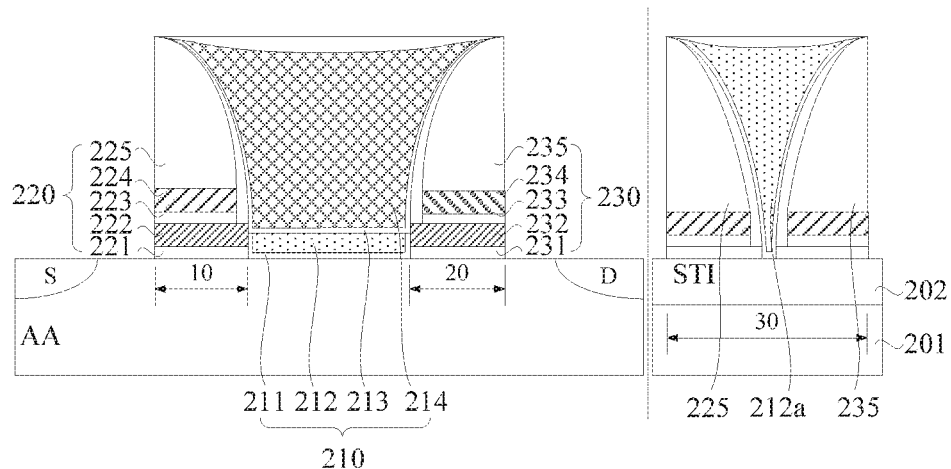

Referring to FIG. 5i, step S9 may include etching the hard mask layer 207 and the underlying control-gate layer 206, control-gate dielectric layer 205, floating-gate layer 204 and floating-gate oxide layer 203, forming, on opposing sides of the word-line structure 210, a first memory bit structure 220 over the first memory region 10 and a second memory bit structure 230 over the second memory region 20. As noted above, the first memory bit structure 220 includes the first floating-gate oxide layer 221 on the surface of the semiconductor substrate 201, the first floating gate 222 on the first floating-gate oxide layer 221, the first control-gate dielectric layer 223 on the first floating gate 222, the first control gate 224 on the first control-gate dielectric layer 223 and the first sidewall 225, wherein the first sidewall 225 covers the upper surface of the first control gate 224 and the end faces of the first control gate 224 and first control-gate dielectric layer 223 that face toward the erase gate 214, and the second memory bit structure 230 includes the second floating-gate oxide layer 231 on the surface of the semiconductor substrate 201, the second floating gate 232 on the second floating-gate oxide layer 231, the second control-gate dielectric layer 233 on the second floating gate 232, the second control gate 234 on the second control-gate dielectric layer 233 and the second sidewall 235, wherein the second sidewall 235 covers the upper surface of the second control gate 234 and the end faces of the second control gate 234 and second control-gate dielectric layer 233 that face toward the erase gate 214.

By way of example, the hard mask layer 207 may be first removed by a wet etching process, followed by removal of the underlying control-gate layer 206, control-gate dielectric layer 205, floating-gate layer 204 and floating-gate oxide layer 203 by a dry etching process using the first sidewall 225, the second sidewall 235 and the capping layer 208 (or patterned photoresist) as an etching mask.

Thus, in the structure resulting from steps S1 to S9, the first memory bit structure 220 is formed over the first memory region 10 of the semiconductor substrate 201, and the second memory bit structure 230 over the second memory region 2C) of the semiconductor substrate 201. The word-line structure 210 is formed between the first memory bit structure 220 and the second memory bit structure 230. The word-line structure 210 includes the read gate 212 and the erase gate 214 that are separated from each other by the dielectric oxide layer 213. The dielectric oxide layer 213 may serve as a tunneling oxide layer between the first floating gate 222 and the erase gate 214 and/or between the second floating gate 232 and the erase gate 214.

Further, in some embodiments of the present invention, the method may additionally include the steps of: forming second spacers over the sides of the first memory bit structure 220 and second memory bit structure 230 that are distant from the word-line structure 210; forming a source region (S) and a drain region (D) by implanting ions into the semiconductor substrate 201 on the sides of the second spacers distant from the word-line structure 210; and forming contacts respectively on the source region, the drain region, the first control gate 224, the second control gate 234, the erase gate 214 and the read-gate connect-out layer 212a. The contacts on the source region and the drain region may be connected to bit lines (BLs) of the split-gate flash memory, the contact on the erase gate 214 to an erase word line of the split-gate flash memory, and the contact on the read-gate connect-out layer 212a to a read word line of the split-gate flash memory. In specific implementations, the contacts may be metal plugs formed in the source and drain regions of the semiconductor substrate 201 using any suitable method disclosed in the art, a detailed description thereof is deemed unnecessary and omitted herein.

In order for the subject matter disclosed hereinabove to be better implemented, in embodiments of the present invention, a method for controlling the foregoing split-gate flash memory 200 is provided.

Referring to FIG. 2, the split-gate flash memory 200 includes the first memory bit structure 220 over the first memory region 10 and the second memory bit structure 230 over the second memory region 20, with the word-line structure 210 being situated between the first memory region 10 and the second memory region 20. Therefore, by controlling the associated electrodes, the first memory bit structure 220 and/or the second memory bit structure 230 may each act as a memory bit cell to perform the three operations: programming, reading and erasing.

Specifically, the split-gate flash memory 200 may perform a program operation under the action of a control process including: applying a first BL programming voltage (e.g. 4-6 V) to a bit line for the memory bit cell to be programmed and a second BL programming voltage (e.g., 0.1 V) that is lower than the first BL programming voltage to another BL on the other side of the memory bit cell, so that a channel wider the memory bit cell is activated; applying a word-line programming voltage (e.g. 1.5 V) to the word lines (including both the read word line in contact with the read-gate connect-out layer 212a and the erase word line in contact with the erase gate 214) to select the memory bit cell; and applying a control-gate programming voltage (e.g., 8 V) to a control gate associated with the memory bit cell and a voltage that is the same in magnitude as the first BL programming voltage to an adjacent control gate, so that electrons in the activated channel are pulled into the floating gate of the memory bit cell and programming of the memory bit cell is achieved.

The split-gate flash memory 200 may perform a read operation under the action of a control process including: grounding a bit line on one side of the memory bit cell to be read and charging an adjacent bit line to a BL reading voltage (e.g., 1 V); grounding, zeroing or floating the erase word line in contact with the erase gate 214 of the memory bit cell and applying a word-line reading voltage to the read gate 212 thereof through the read word line in contact with the read-gate connect-out layer 212a, wherein the word-line reading voltage is about 1 V to 6 V, preferably, 1 V to 2 V, which is lower than a word-line reading voltage adopted in the conventional split-gate flash memory because, as mentioned above, the word-line oxide layer according to embodiments of the present invention may have a thickness that is smaller than a word-line oxide layer thickness employed in the conventional split-gate flash memory; grounding a control gate associated with the memory bit cell and applying a control-gate reading voltage (e.g., 4.5 V) to an adjacent control gate so that the difference between the BL reading voltage and the control-gate reading voltage is greater than a threshold voltage, activating a channel associated with the adjacent memory bit cell; and determining whether a datum stored on the memory bit cell represents "0" or "1" by detecting whether there is a current in an associated channel wider the memory bit cell, which will be created when the quantity of electrons in the floating gate of the memory bit cell is great enough to activate the channel.

The split-gate flash memory 200 may perform an erase operation under the action of a control process including: grounding or floating all bit lines; grounding, zeroing or floating the read word line in contact with the read-gate connect-out layer 212.a and applying a word line erasing voltage to the erase gate 214 through the erase word line in contact with the erase gate 214, wherein the word-line erasing voltage ranges from about 7 V to 9 V; and applying, to an associated control gate of the memory bit cell to be erased, a control-gate erasing voltage which is a negative voltage ranging from about −5 V to −9 V so that electrons in the floating gate of the memory bit cell are pulled into the erase gate 214 due to the difference between the word line erasing voltage and the control gate erasing voltage (greater than 10 V) and erasing of the memory bit cell is achieved.

In summary, in embodiments of the present invention, there are provided a split-gate flash memory, a method of fabricating the split-gate flash memory and a method for control thereof. A word-line structure in the split-gate flash memory includes a read gate and an erase gate. The read gate can be external connected by a read-gate connect-out layer, and each of the read gate and erase gate can function as a word line to enable a read or erase operation. Accordingly, the following advantage can be offered.

Firstly, in order to avoid the occurrence of a leakage current in a channel under the word line during an erase operation of the split-gate flash memory, a dielectric oxide layer, a word-line oxide layer and the read gate are arranged under the erase gate of the split-gate flash memory in embodiments of the present invention. As a result, a voltage applied on the erase gate will have a reduced impact on the channel in the semiconductor substrate, and the word-line oxide layer is allowed to be made thinner, which can result in a lower channel resistance induced by the word-line structure.

Secondly, in embodiments of the present invention, erasing is enabled only by the erase gate that overlies the read gate and has a minimal overlap with each of the first floating gate and the second floating gate. This results in a low coupling ratio which allows a lower coupled voltage on the first or second floating gate and a stronger electric field under the same erasing conditions, making electrons easier to tunnel from the first or second floating gate into the erase gate. As a result, higher erasing performance can be achieved.

Thirdly, in embodiments of the present invention, the read gate has a small thickness, which can lower or even eliminate a word line-induced barrier. This, coupled with the thinner word-line oxide layer, enables a satisfactorily low channel resistance induced by the word-line structure even when a low word-line reading voltage is applied on the read gate. Thus, short-channel effect suppression is achieved, and a window between the states in which read and erase operations are performed can be expanded, which is favorable to mass production.

Fourthly, in embodiments of the present invention, the read gate extends to the connect-out region and is joined to the read-gate connect-out layer. This allows the external electrical connection of the read gate to be accomplishable by existing processes for fabricating interconnects and metal plugs, making the fabrication easier.

The foregoing embodiments of the split-gate flash memory, the method of fabricating it and the method for control thereof are described with individual emphases placed on differences therebetween. Reference can be made between the embodiments for a detail description of any similarity between them.

The preferred embodiments presented above are merely examples and are in no way meant to limit the present invention. Possible modifications and variations may be made to the subject matter of the present invention by those skilled in the art based on the above teachings without departing from the scope of the invention. Accordingly, any simple variations, equivalent changes and modifications made to the foregoing embodiments based on the substantive disclosure of the invention without departing from the scope thereof fall within the scope.

What is claimed is:

1. A split-gate flash memory, comprising:
a semiconductor substrate comprising a first memory region and a second memory region separate from each other; and
a word-line structure between the first memory region and the second memory region, the word-line structure comprising, stacked on a surface of the semiconductor substrate sequentially from bottom to top, a word-line oxide layer, a read gate, a dielectric oxide layer and an erase gate,
wherein the semiconductor substrate further comprises a connect-out region that is separate from each of the first memory region, the second memory region and the word-line structure, wherein the split-gate flash memory further comprises a read-gate connect-out layer over the connect-out region, and wherein the read gate extends to the connect-out region and is connected with the read-gate connect-out layer, and
wherein the read-gate connect-out layer has a width smaller than a width of the read gate and has an upper surface higher than an upper surface of the read gate.

2. The split-gate flash memory of claim 1, wherein the upper surface of the read-gate connect-out layer is flush with an upper surface of the erase gate.

3. The split-gate flash memory of claim 1, further comprising a first memory bit structure over the first memory region of the semiconductor substrate and a second memory bit structure over the second memory region of the semiconductor substrate, the first memory bit structure comprising, stacked on the surface of the semiconductor substrate sequentially from bottom to top, a first floating gate, a first control-gate dielectric layer, a first control gate and a first sidewall, the second memory bit structure comprising, stacked on the surface of the semiconductor substrate sequentially from bottom to top, a second floating gate, a second control-gate dielectric layer, a second control gate and a second sidewall, the first and second sidewalls extending to the connect-out region and sandwiching the read-gate connect-out layer.

4. The split-gate flash memory of claim 3, wherein the erase gate has a lower surface lower than or flush with upper surfaces of the first and second floating gates.

5. The split-gate flash memory of claim 3, wherein the dielectric oxide layer is located between the first floating gate and the erase gate as well as between the second floating gate and the erase gate to serve as a tunneling oxide layer for the split-gate flash memory.

6. The split-gate flash memory of claim 1, wherein the word-line oxide layer has a thickness of from 20 Å to 100 Å, and wherein the dielectric oxide layer has a thickness of from 80 Å to 200 Å.

7. A method of fabricating a split-gate flash memory, comprising:
providing a semiconductor substrate comprising a first memory region and a second memory region separate from each other; and
forming a word-line structure between the first memory region and the second memory region, the word-line structure comprising, stacked on a surface of the semiconductor substrate sequentially from bottom to top, a word-line oxide layer, a read gate, a dielectric oxide layer and an erase gate,
wherein the semiconductor substrate comprises an active region containing both the first memory region and the second memory region and an isolation region containing a connect-out region, and prior to forming the word-line structure, the method further comprises:
sequentially depositing a floating-gate oxide layer, a floating-gate layer, a control-gate dielectric layer, a control-gate layer and a hard mask layer over the active region of the semiconductor substrate, wherein each of the floating-gate oxide layer, the control-gate dielectric layer, the control-gate layer and the hard mask layer further covers the isolation region of the semiconductor substrate;
forming a first trench that penetrates through the hard mask layer, the first trench extending from the active region to the isolation region and having a first width over the active region and a second width over the isolation region that is smaller than the first width;
forming first sub-sidewalls within the first trench, and with the first sub-sidewalls and the remaining hard mask layer together serving as a mask, etching the control-gate layer and the control-gate dielectric layer to form a second trench that penetrates through each of the hard mask layer, the control-gate layer and the control-gate dielectric layer; and
forming second sub-sidewalls which cover the first sub-sidewalls and end faces of the control-gate layer and the control-gate dielectric layer under the first sub-sidewalls, and with the first sub-sidewalls, the second sub-sidewalls and the hard mask layer together serving as a mask, etching the floating-gate layer to form a word-line trench that penetrates through each of the hard mask layer, the control-gate layer, the control-gate dielectric layer and the floating-gate layer, the word-line trench extending from the active region to the isolation region and having a third width over the active region and a fourth width over the isolation region that is smaller than the third width.

8. The method of claim 7, wherein forming the word-line structure comprises the steps of:
forming the word-line oxide layer over the semiconductor substrate with the word-line trench formed therein;
forming a read-gate layer over the word-line oxide layer and etching back the read-gate layer to form the read gate and a read-gate connect-out layer, the read-gate connect-out layer having an upper surface higher than an upper surface of the read gate;
forming the dielectric oxide layer over the semiconductor substrate with the read gate and the read-gate connect-out layer formed thereon; and
forming an erase-gate material layer over the dielectric oxide layer and removing a portion of the erase-gate material layer over the isolation region so that a remainder of the erase-gate material layer within the word-line trench constitutes the erase gate and that the word-line oxide layer, the read gate, the dielectric oxide layer and the erase gate collectively constitute the word-line structure.

9. The method of claim 7, further comprising, subsequent to the formation of the word-line structure: etching the hard mask layer and the control-gate layer, the control-gate dielectric layer and the floating-gate layer underlying the hard mask layer, thereby forming a first memory bit structure over the first memory region and a second memory bit structure over the second memory region on opposing sides of the word-line structure.

10. A method for controlling a split-gate flash memory, wherein the split-gate flash memory comprises:
a semiconductor substrate comprising a first memory region and a second memory region separate from each other; and
a word-line structure between the first memory region and the second memory region, the word-line structure comprising, stacked on a surface of the semiconductor substrate sequentially from bottom to top, a word-line oxide layer, a read gate, a dielectric oxide layer and an erase gate,
wherein the semiconductor substrate further comprises a connect-out region that is separate from each of the first memory region, the second memory region and the word-line structure, wherein the split-gate flash memory further comprises a read-gate connect-out layer over the connect-out region, and wherein the read gate extends to the connect-out region and is connected with the read-gate connect-out layer, and
wherein the read-gate connect-out layer has a width smaller than a width of the read gate and has an upper surface higher than an upper surface of the read gate, and
wherein the method comprises:
performing a read operation by grounding or floating the erase gate and applying a word-line reading voltage to the read gate; and/or
performing an erase operation by grounding or floating the read gate and applying a word-line erasing voltage to the erase gate.

11. The method of claim 10, wherein the word-line reading voltage ranges from 1 V to 2 V.

12. The method of claim 10, wherein the word-line erasing voltage ranges from 7 V to 9 V.

* * * * *